US006771945B1

(12) United States Patent
Pickett et al.

(10) Patent No.: US 6,771,945 B1
(45) Date of Patent: Aug. 3, 2004

(54) DYNAMIC DC BALANCING OF A DIRECT CONVERSION RECEIVER AND METHOD

(75) Inventors: Michael Newton Pickett, Fountain Hills, AZ (US); Eric Trelewicz, Louisville, CO (US)

(73) Assignee: General Dynamics Decision Systems, Inc., Scottsdale, AZ (US)

( * ) Notice: Subject to any disclaimer, the term of this patent is extended or adjusted under 35 U.S.C. 154(b) by 0 days.

(21) Appl. No.: 09/578,112

(22) Filed: May 24, 2000

(51) Int. Cl.[7] .............................................. H04B 1/26
(52) U.S. Cl. ..................................... 455/324; 455/323
(58) Field of Search ................................ 455/324, 311, 455/296, 334; 327/323, 307; 375/346, 349

(56) References Cited

U.S. PATENT DOCUMENTS

| | | | | |
|---|---|---|---|---|
| 5,422,889 A | * | 6/1995 | Sevenhans et al. | 370/442 |
| 5,471,665 A | * | 11/1995 | Pace et al. | 455/343.2 |
| 5,724,653 A | * | 3/1998 | Baker et al. | 455/296 |
| 5,953,643 A | * | 9/1999 | Speake et al. | 455/324 |
| 6,009,126 A | * | 12/1999 | Van Bezooijen | 375/319 |
| 6,118,322 A | * | 9/2000 | Bockelman et al. | 327/317 |
| 6,298,226 B1 | * | 10/2001 | Lloyd et al. | 455/296 |
| 6,459,889 B1 | * | 10/2002 | Ruelke | 455/296 |
| 6,509,777 B2 | * | 1/2003 | Razavi et al. | 327/307 |

* cited by examiner

*Primary Examiner*—Lee Nguyen
*Assistant Examiner*—Lewis West
(74) *Attorney, Agent, or Firm*—Jenner & Block LLP

(57) ABSTRACT

A direct conversion receiver includes a differential mode mixer with first and second DC coupled amplifier chains, the first and second amplifier chains are connected to the mixer for amplifying differential signals. A common mode offset correction circuit is coupled to the first and second amplifier chains so as to feedback correction signals that cause common mode DC offsets in the first and second amplifier chains to be equal and opposite. A differential mode offset correction circuit is coupled to the first and second amplifier chains so as to feedback correction signals that cause differential mode DC offsets in the first and second amplifier chains to be equal. The only solution for the two correction circuits is zero DC offset.

16 Claims, 2 Drawing Sheets

DYNAMIC DC BALANCING OF A DIRECT CONVERSION RECEIVER AND METHOD

FIELD OF THE INVENTION

This invention relates to apparatus and method for reducing DC offsets in a direct conversion receiver.

BACKGROUND OF THE INVENTION

For purposes of this disclosure it will be understood that "direct conversion" receivers are communications receivers which receive radio frequency (RF) signals modulated with voice, data, etc. and convert the RF directly to a near DC Intermediate Frequency (IF) or spectrum of frequencies. Generally, the RF signals are received by a standard front end and coupled to a mixer where they are mixed with a local oscillator (LO) output and applied to one or more DC coupled amplifier chains. In DC coupled amplifier chains used in direct conversion receivers, DC offsets from the conversion mixer and components in the amplifier chain may, when amplified by the amplifier chain, saturate the output stages and suppress the processing of the desired base-band signal. In-line high pass filters (e.g., large AC coupling capacitors) introduce long settling times. The long settling times are especially of concern when the receiver is recovering from initial start-up transients, transients introduced by circuit configuration changes, or responding to DC component changes from the conversion mixer due to LO level and signal level variations across the different frequency bands.

In a software configurable radio receiver, the DC coupled amplifier chain or chains may be called upon to optimize operation with different signal-coding schemes, different RF input levels, and/or different signal bandwidths. In addition, the receiver front end may be reconfigured for different RF operating frequencies. As the coding schemes vary and mixer operating frequencies vary, differing operating characteristics will be required in the DC coupled amplifier chain or chains. Adapting to these different environments produces variable and possibly unpredictable DC offsets. In this environment, the DC coupled amplifier chain or chains has even more stringent requirements for DC balance than ever required on a single purpose receiver. With extended performance environment, the receiver requires the capability to suppress the DC signal components quickly and then pass the undistorted IF or base band signal.

Accordingly it is highly desirable to provide apparatus and a method of overcoming this problem which is inexpensive and easy to use.

BRIEF DESCRIPTION OF THE DRAWINGS

Referring to the drawings.

DESCRIPTION OF THE PREFERRED EMBODIMENT

Figure 1:
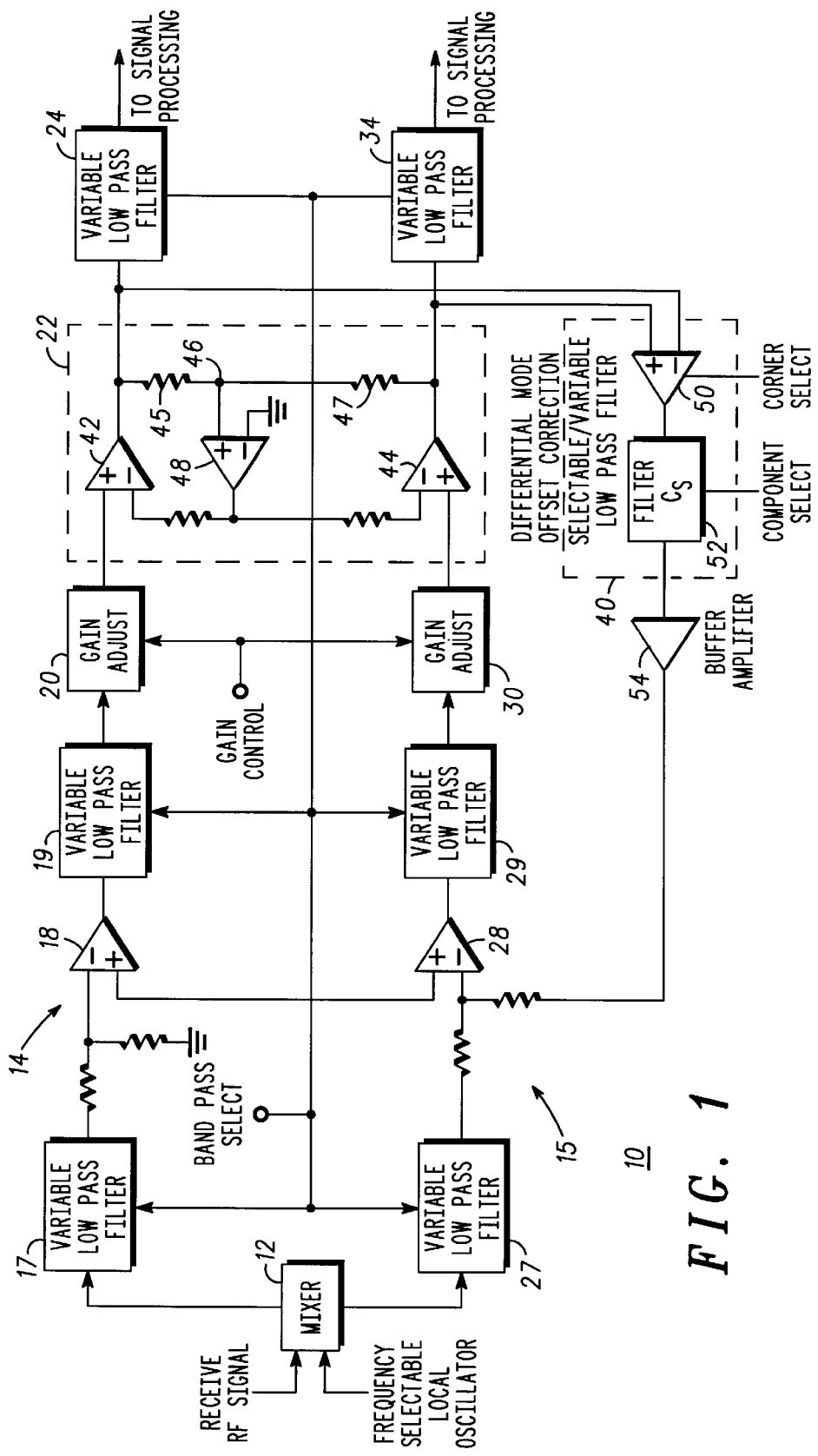
FIG. 1 is a simplified schematic/block diagram of a portion of a direct conversion receiver in accordance with the present invention.

Turning now to FIG. 1, a simplified schematic/block diagram is illustrated of a portion of a direct conversion receiver 10 in accordance with the present invention. Receiver 10 includes a front end (not shown) which receives and delivers selected radio frequency (RF) signals to a mixer 12. A local oscillator (LO), which is frequency selectable for operating at different frequencies, also supplies signals to mixer 12. The RF and LO signals are mixed in mixer 12 in a well known fashion to supply differential signals to a first DC coupled amplifier chain 14 and to a second DC coupled amplifier chain 15. While a single pair of DC coupled amplifier chains are illustrated and described herein, it will be understood by those skilled in the art that additional pairs of amplifier chains may be utilized (e.g., for in-phase and quadrature signals) depending upon the type of receiver, type of modulation, etc.

Amplifier chain 14 includes a variable low pass filter 17 which connects one differential output from mixer 12 to the negative input terminal of an operational amplifier 18. Generally, operational amplifier 18 is simply an amplifier which includes one or more stages of amplification that provide the desired gain for amplifier chain 14. The output of operational amplifier 18 is connected through a second variable low pass filter 19 to a gain adjustment circuit 20. The output of gain adjustment circuit 20 is supplied through a common mode offset correction circuit 22 to a final variable low pass filter 24. Similarly, amplifier chain 15 includes a variable low pass filter 27 which connects one differential output from mixer 12 to the negative input terminal of an operational amplifier 28. Generally, operational amplifier 28 is simply an amplifier which includes one or more stages of amplification that provide the desired gain for amplifier chain 15. The output of operational amplifier 28 is connected through a second variable low pass filter 29 to a gain adjustment circuit 30. The output of gain adjustment circuit 30 is supplied through common mode offset correction circuit 22 to a final variable low pass filter 34. Variable low pass filters 17, 19, 24, 27, 29, and 34 are all adjustable to select a desirable bandpass for receiver 10. A reference is applied to the positive input terminals of operational amplifiers 18 and 28 to remove any static DC offset voltage.

Figure 2:
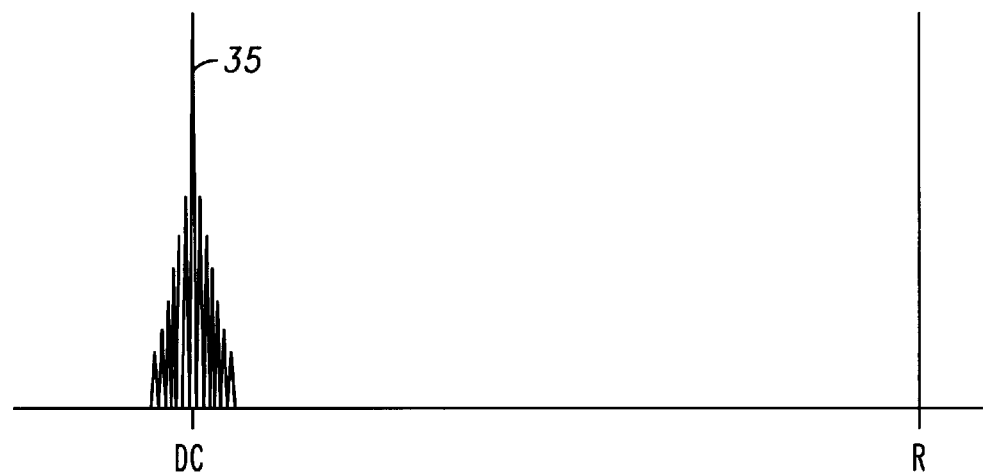
FIG. 2 is a graphical representation of received and conversion frequencies of the receiver in FIG. 1.

Since receiver 10 is a direct conversion type of receiver, it will be understood that the received radio frequency (RF) signals modulated with voice, data, etc. are converted by mixer 12 and amplifier chains 14 and 15 to a near DC IF or spectrum of frequencies. Referring additionally to FIG. 2, a graphical representation of the received RF signal converted to a near DC IF signal with a large DC component is illustrated. The information (e.g., voice, data, etc.) modulated onto the RF signal appears as side lobes around the DC component. The signals at the outputs of final variable low pass filters 24 and 34 is coupled to signal processing circuits (not shown) which may include, for example, analog-to-digital converters or the like. Since the output signals from amplifier chains 14 and 15 are near DC (very low frequency) they are easily converted to digital signals for further processing or use.

However, as is well known in the art, any or all of the components in each of the mixer 12 and amplifier chains 14 and 15 may add a DC offset to the signal passing through. Also, as mentioned briefly above, in DC coupled amplifier chains used in direct conversion receivers, these DC offsets from the conversion mixer and components in the amplifier chain may, when amplified by the amplifier chain, saturate the output stages and suppress the processing of the desired base-band signal. These DC offsets are represented by a large DC component, designated 35, in FIG. 2.

In direct conversion receiver 10 of FIG. 1, the DC offset problem is addressed by including common mode offset correction circuit 22 coupled to first and second DC coupled amplifier chains 14 and 15 so as to cause common mode DC offsets in first and second DC coupled amplifier chains 14 and 15 to be equal and opposite. Also, included in receiver 10 is a differential mode offset correction circuit 40 coupled to first and second DC coupled amplifier chains 14 and 15 so as to cause differential mode DC offsets in first and second DC coupled amplifier chains 14 and 15 to be equal. As will be understood presently, the only solution for the two correction circuits 22 and 40 is a zero DC offset. It should also be understood that a variety of common mode offset correction circuits and/or differential mode offset correction circuits can be devised to perform the above functions and the circuits described below are a preferred circuit because of their simplicity and accuracy of operation.

Common mode offset correction circuit 22, in this preferred embodiment, includes an operational amplifier 42 having a positive input terminal connected to the output terminal of gain adjustment circuit 20 and an output terminal connected to variable low pass filter 24. Similarly, circuit 22 includes an operational amplifier 44 having a positive input terminal connected to the output terminal of gain adjustment circuit 30 and an output terminal connected to variable low pass filter 34. The output terminal of operational amplifier 42 is also connected through a load (represented as a resistor 45) to a junction 46 and the output terminal of operational amplifier 44 is connected through a load (represented as a resistor 47) to junction 46. Resistors 45 and 47 are equal so that the potential at junction 46 is null or zero when the signals at the output terminals of operational amplifiers 42 and 44 are equal and opposite.

Junction 46 is connected to a positive input terminal of a operational amplifier 48, the negative input terminal of which is connected to a common potential, such as ground. The output terminal of operational amplifier 48 is connected in a feedback configuration to negative input terminals of operational amplifiers 42 and 44. As will be understood by those skilled in the art, most desirable signals appearing at the output terminals of operational amplifiers 42 and 44 are differential signals (i.e., they are equal and opposite in polarity) produced by the differential action of mixer 12. However, when DC offsets are produced in any of the components they can appear in only one amplifying chain 14 or 15, or they can appear in both chains but will not be of opposite polarity. Thus, the potential at junction 46 will not be null or zero and a signal will be applied to operational amplifier 48 which will develop a common mode offset correction signal and feed back the common mode offset correction signal to amplifier chain 14 and 15 to cause the common mode DC offset to be equal and opposite (i.e., null the signal at junction 46).

The common mode correction could also be applied differentially to amplifiers 18 and 28, which would be a preferred method if the circuit is provided in an integrated circuit form.

Differential mode offset correction circuit 40, in this preferred embodiment, includes a transconductance amplifier 50 having a first input terminal (+) connected to the output terminal of operational amplifier 42 and a second input terminal (−) connected to the output terminal of operational amplifier 44. The output terminal of transconductance amplifier 50 is coupled to a selectable capacitor which, together with a buffer amplifier 54, form a low pass filter 52. Buffer amplifier 54 is coupled to the negative input terminal of operational amplifier 28.

As is known in the art, transconductance amplifier 50 provides a signal at the output terminal which is dependent upon the relationship of the two signals applied to the input terminals. That is, if the signals are equal, the output current is zero into a filter capacitor (not shown) included in the filter 52 and the signal applied to the negative input of operational amplifier 28 is constant. If the output of operational amplifier 42 is higher than the output of operational amplifier 44, a signal is applied to the negative input of operational amplifier 28 which increases the amplitude of the differential signal in amplifier chain 15. If the output of operational amplifier 42 is lower than the output of operational amplifier 44, a signal is applied to the negative input of operational amplifier 28 which decreases the amplitude of the differential signal in amplifier chain 15. Thus, differential mode offset correction circuit 40 causes differential mode DC offsets in first and second DC coupled amplifier chains 14 and 15 to be equal. It will be understood that, as the differential loop attempts to make the DC offsets equal, the common mode loop is attempting to make the DC offsets equal but opposite. The result is 0V DC offset at the output of amplifier chains 14 and 15.

The bandwidth of common mode offset correction circuit 22 can be as wide as desired since it will not affect the common mode IF signal. The bandwidth of differential mode offset correction circuit 40 is important because it determines acquisition time, i.e., how fast the DC component will be driven to zero. In its simplest form, differential mode offset correction circuit 40 is a high pass filter in the IF path. The bandwidth of differential mode offset correction circuit 40 can be programmed under processor control (e.g., the same processor that controls the frequency, etc. of receiver 10) over several decades. The bandwidth is made selectable or variable by including a programmable transconductance amplifier (amplifier 50) and a selectable/variable low pass filter 52 (e.g., a variable capacitor or a bank of capacitors).

Figure 3:
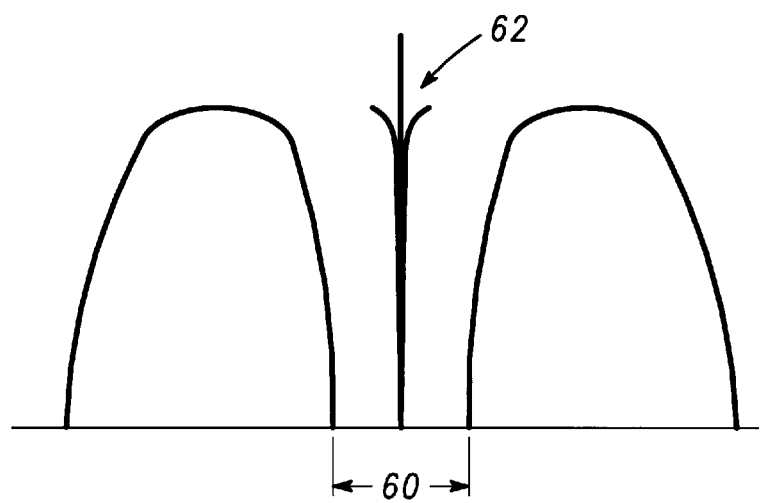
FIG. 3 is an enlarged detail view of the passband and operating modes of the portion of the direct conversion receiver of FIG. 1.

In typical operation, the DC correction circuit bandwidth of differential mode offset correction circuit 40 is set wide for rapid DC nulling during a signal acquisition mode of operation and then slewed to a narrower bandwidth during a normal receiver operation mode to allow the IF to pass undistorted. Referring additionally to FIG. 3, an enlarged detail view is illustrated of the nulling and operating modes of receiver 10. The graph of FIG. 3 represents the IF response of receiver 10 with a first wide bandwidth (in this preferred embodiment greater than 300 Hz) designated 60 and a second narrower bandwidth (in this preferred embodiment equal to or less than 1 Hz) designated 62. By implementing the nulling circuit in two parts (i.e., circuits 22 and 40), the variable bandwidth feature is simplified so that only one time constant is required for both sides (chains 14 and 15) of the differential signal path. This time constant can be changed over a wide range using programmable transconductance amplifier 50 and/or selectable/variable low pass filter 52. The time constant can be changed over its wide range using programmable transconductance amplifier 50 with no discontinuities for smooth transition from DC nulling acquisition to signal demodulation. Here it should be noted that the functions of all or any convenient portions of receiver 10 could be performed digitally in a Digital Signal Processor (DSP) or the like.

Thus, a new and improved dynamic DC balancing circuit for use in a direct conversion receiver is disclosed which requires no alignment/trimming at test to eliminate DC offset. The DC balancing circuit employs closed loop feedback to correct any DC offset errors. The dynamic DC balancing circuit adapts rapidly to changing DC offset levels resulting from different receiver/LO frequencies and power levels. Also, the dynamic DC balancing circuit corrects for component tolerances, component to component variations, and tolerance drifts as a result of component aging and environmental temperature. Further, after fast acquisition of proper DC operating points, the system is capable of slewing to a selected high pass filter response for a chosen receiver configuration.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A dynamic DC balancing circuit in a direct conversion receiver comprising:
   a direct conversion receiver including a differential mode mixer with first and second DC coupled amplifier chains, the first and second DC coupled amplifier chains being connected to the mixer for amplifying differential signals;
   a common mode offset correction circuit coupled to the first and second DC coupled amplifier chains so as to cause common mode DC offsets in the first and second DC coupled amplifier chains to be equal and opposite; and
   a differential mode offset correction circuit coupled to the first and second DC coupled amplifier chains so as to cause differential mode DC offsets in the first and second DC coupled amplifier chains to be equal.

2. A dynamic DC balancing circuit in a direct conversion receiver as claimed in claim 1 wherein the common mode offset correction circuit includes a first operational amplifier having a first input and an output connected into the first DC coupled amplifier chain, a second operational amplifier having a first input and an output connected into the second DC coupled amplifier chain, and a third operational amplifier having an output connected to second inputs of each of the first and second operational amplifiers, a first input connected to the outputs of each of the first and second operational amplifiers, and a second input connected to a reference potential.

3. A dynamic DC balancing circuit in a direct conversion receiver as claimed in claim 1 wherein the differential mode offset correction circuit includes a transconductance amplifier having a first input connected to the first DC coupled amplifier chain, a second input connected to the second DC coupled amplifier chain, and an output connected through a low pass filter to one of the first and second DC coupled amplifier chains.

4. A dynamic DC balancing circuit in a direct conversion receiver as claimed in claim 3 wherein the transconductance amplifier includes a switchable bandwidth.

5. A dynamic DC balancing circuit in a direct conversion receiver as claimed in claim 4 wherein the low pass filter includes switchable components for changing the bandwidth of the differential mode offset correction circuit.

6. A dynamic DC balancing circuit in a direct conversion receiver as claimed in claim 1 wherein the differential mode offset correction circuit is switchable between a wide bandpass DC nulling mode of operation and a narrow bandpass receiver operation mode.

7. A dynamic DC balancing circuit in a direct conversion receiver as claimed in claim 6 wherein the bandpass of the differential mode offset correction circuit in the DC nulling mode is greater than approximately 300 Hz and the bandpass of the differential mode offset correction circuit in the receiver operation mode is approximately 1 Hz.

8. A dynamic DC balancing circuit in a direct conversion receiver as claimed in claim 1 wherein the common mode offset correction circuit and the differential mode offset correction circuit are coupled to the first and second DC coupled amplifier chains to provide feedback signals to the first and second DC coupled amplifier chains.

9. A dynamic DC balancing circuit in a direct conversion receiver comprising:
   a direct conversion receiver including a differential mode mixer with first and second DC coupled amplifier chains, the first and second DC coupled amplifier chains being connected to the mixer for amplifying differential signals;
   a common mode offset correction circuit coupled to the first and second DC coupled amplifier chains so as to provide feedback signals that cause common mode DC offsets in the first and second DC coupled amplifier chains to be equal and opposite, the common mode offset correction circuit including a first operational amplifier having a first input and an output connected into the first DC coupled amplifier chain, a second operational amplifier having a first input and an output connected into the second DC coupled amplifier chain, and a third operational amplifier having an output connected to second inputs of each of the first and second operational amplifiers, a first input connected to the outputs of each of the first and second operational amplifiers, and a second input connected to a reference potential; and
   a differential mode offset correction circuit coupled to the first and second DC coupled amplifier chains so as to provide feedback signals that cause differential mode DC offsets in the first and second DC coupled amplifier chains to be equal, the differential mode offset correction circuit including a transconductance amplifier having a first input connected to the first DC coupled amplifier chain, a second input connected to the second DC coupled amplifier chain, and an output connected through a low pass filter to one of the first and second DC coupled amplifier chains.

10. A dynamic DC balancing circuit in a direct conversion receiver as claimed in claim 9 wherein the transconductance amplifier includes a switchable bandwidth.

11. A dynamic DC balancing circuit in a direct conversion receiver as claimed in claim 9 wherein the low pass filter includes switchable components for changing the bandwidth of the differential mode offset correction circuit.

12. A dynamic DC balancing circuit in a direct conversion receiver as claimed in claim 9 wherein the differential mode offset correction circuit is switchable between a wide bandpass DC nulling mode of operation and a narrow bandpass receiver operation mode.

13. A dynamic DC balancing circuit in a direct conversion receiver as claimed in claim 12 wherein the bandpass of the differential mode offset correction circuit in the DC nulling mode is greater than approximately 300 Hz and the bandpass of the differential mode offset correction circuit in the receiver operation mode is approximately 1 Hz.

14. A method of dynamically DC balancing a direct conversion receiver comprising the steps of:

providing a direct conversion receiver including a differential mode mixer with first and second DC coupled amplifier chains, the first and second DC coupled amplifier chains being connected to the mixer for amplifying differential signals;

developing common mode offset correction signals and feeding back the common mode offset correction signals to the first and second DC coupled amplifier chains to cause common mode DC offsets in the first and second DC coupled amplifier chains to be equal and opposite; and developing differential mode offset correction signals and feeding back the differential mode offset correction signals to the first and second DC coupled amplifier chains to cause differential mode DC offsets in the first and second DC coupled amplifier chains to be equal.

15. A method of dynamically DC balancing a direct conversion receiver as claimed in claim 14 wherein the step of developing differential mode offset correction signals and feeding back the differential mode offset correction signals includes the steps of developing and feeding back the differential mode offset correction signals first in a wide bandpass DC nulling mode of operation and second in a narrow bandpass receiver operation mode.

16. A method of dynamically DC balancing a direct conversion receiver as claimed in claim 15 wherein the bandpass in the DC nulling mode is greater than approximately 300 Hz and the bandpass in the receiver operation mode is approximately 1 Hz.

* * * * *